US006528767B2

(12) United States Patent
Bagley et al.

(10) Patent No.: US 6,528,767 B2
(45) Date of Patent: Mar. 4, 2003

(54) PRE-HEATING AND LOAD LOCK PEDESTAL MATERIAL FOR HIGH TEMPERATURE CVD LIQUID CRYSTAL AND FLAT PANEL DISPLAY APPLICATIONS

(75) Inventors: William A. Bagley, San Jose, CA (US); Ericka M. Ramirez, Gilroy, CA (US); Stephen C. Wolgast, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/963,020

(22) Filed: Sep. 24, 2001

(65) Prior Publication Data

US 2002/0175160 A1 Nov. 28, 2002

Related U.S. Application Data

(60) Provisional application No. 60/293,009, filed on May 22, 2001.

(51) Int. Cl.[7] .................................................. F27B 5/14
(52) U.S. Cl. .................... 219/390; 219/405; 219/411; 392/416; 392/418; 118/724; 118/725; 118/50.1
(58) Field of Search ................................. 219/390, 405, 219/411; 392/416, 418; 118/724, 725, 728, 50.1

(56) References Cited

U.S. PATENT DOCUMENTS

| 4,958,061 | A | * | 9/1990 | Wakabayashi et al. ....... 219/411 |
| 5,850,071 | A | * | 12/1998 | Makiguchi et al. .......... 219/390 |
| 5,984,391 | A | | 11/1999 | Vanderpot et al. ........... 294/1.1 |
| 6,077,026 | A | | 6/2000 | Shultz ..................... 414/744.1 |
| 6,146,504 | A | * | 11/2000 | Patadia et al. .......... 204/192.12 |
| 6,213,704 | B1 | | 4/2001 | White et al. ................. 414/217 |
| 6,256,555 | B1 | | 7/2001 | Bacchi et al. ................ 700/245 |
| 6,257,827 | B1 | | 7/2001 | Hendrickson et al. ....... 414/805 |
| 6,343,183 | B1 | * | 1/2002 | Halpin et al. ................ 392/416 |
| 6,345,150 | B1 | * | 2/2002 | Yoo ........................... 392/418 |

* cited by examiner

*Primary Examiner*—Teresa Walberg
*Assistant Examiner*—Shawntina T. Fuqua
(74) *Attorney, Agent, or Firm*—Moser, Patterson & Sheridan, LLP (57) ABSTRACT

An apparatus for supporting a glass substrate is provided. In one embodiment, a substrate support is provided having a base structural member and an upper top portion having a surface thereon adapted to minimize friction and/or chemical reactions between the substrate support and a glass substrate supported thereon. The substrate supports may be utilized in various chambers such as load locks chamber and chambers having thermal processes.

43 Claims, 4 Drawing Sheets

Fig. 4

PRE-HEATING AND LOAD LOCK PEDESTAL MATERIAL FOR HIGH TEMPERATURE CVD LIQUID CRYSTAL AND FLAT PANEL DISPLAY APPLICATIONS

This application claims benefit of U.S. Provisional Application No. 60/293,009, filed May 22, 2001, which is hereby incorporated by reference in its entirety.

BACKGROUND OF THE INVENTION

1. Field of the Invention

The present invention relates to a support member for large area glass substrates. More particularly, the invention relates to a support member for supporting large area glass substrates during high temperature processes.

2. Description of the Related Art

Thin film transistors have been made heretofore on large glass substrates or plates for use in monitors, flat panel displays, solar cells, personal digital assistants (PDA), cell phones and the like. The transistors are made by sequential deposition of various films including amorphous silicon, both doped and undoped silicon oxides, silicon nitride and the like in vacuum chambers. Thin films for transistors can be deposited by chemical vapor deposition (CVD) for example. After deposition, many films used for transistor fabrication are subjected to heat processes.

CVD is a comparatively high temperature process requiring that substrates withstand temperatures on the order of 300° to 400° C. Higher temperature processes such as those above 500° C. are envisioned. CVD film processing has found wide spread use in the manufacture of integrated circuits on glass substrates. However, since glass is a dielectric material that is very brittle and is subject to warping or cracking when heated rapidly to high temperatures, care must be taken to adjust the rate of heating large areas of substrates to avoid thermal stress and resulting damage.

Systems exist currently to preheat glass substrates prior to processing and to conductor post processing heat treatment operations. Conventional heating chambers have either one or more heated shelves for heating one or a plurality of glass substrates. Glass is typically supported above a shelf on spacers to improve heat uniformity and throughput. To minimize costs, conventional spacers are typically formed from easily machined metals, such as, for example, stainless steel, aluminum, aluminum nitride, and the like. However, conventional spacers may tend to mar or otherwise damage the surface of the glass, possibly resulting in an imperfection in or on the glass surface. Later, during cleaving operations, the imperfections in or on the glass surface may result in abnormal cleaving operations causing loss of a device or breakage of a substrate.

In some cases, it is believed that portions of the spacer in contact with the glass may react with and temporarily bond to the glass. When these bonds are later broken, residues of the earlier reaction remain on the spacer, potentially damaging the substrate being processed. In addition, the residue poses a risk of damage to substrates processed thereafter or may become a source of contamination within a heat treatment chamber. Moreover, the earlier residue may incite additional chemical reactions between the spacer and the glass or further degrade a spacer support surface or the lifetime of the spacer.

Therefore, there is a need for a glass support for high temperature glass-panel operations that reduces or eliminates glass damage.

SUMMARY OF THE INVENTION

An apparatus for supporting a glass substrate is provided. In one embodiment, a substrate support is provided having a base portion and an upper top portion having a surface thereon adapted to minimize friction and/or chemical reactions between the substrate support and a substrate supported thereon.

In another embodiment, an apparatus for supporting a substrate includes a support element and a plurality of support members. At least one of the support members generally include a base structural member coupled to a first side of the support element and a round top portion adapted to support the glass substrate in a spaced-apart relation to the first side of the support element.

In another embodiment, an apparatus for supporting a substrate includes a shelf and a plurality of support members. At least one of the support members generally includes a base structural member coupled to a first side of the shelf and a round top portion adapted to support the glass substrate in a spaced-apart relation to the first side of the shelf. A coating is disposed on at least a tip of the top portion.

In another embodiment, an apparatus for supporting a substrate includes a chamber and a plurality of shelves disposed in a spaced-apart relation in the chamber. Each shelf has a plurality of support members disposed thereon. At least one of the of the support members generally includes a base structural member coupled to a first side of the shelf and a round top portion adapted to support the glass substrate in a spaced-apart relation to the first side of the shelf.

In yet another embodiment, an apparatus for supporting a glass substrate includes a chamber body and a plurality of support elements coupled a sidewall of the chamber body. The chamber body has a first glass transfer port and a second glass transfer port respectively sealed by a first and second slit valve. A plurality of support members are disposed on the support elements. At least one of the support members includes a base structural member coupled the support elements and a round top portion. The round top portion is adapted to support the glass substrate in a spaced-apart relation to the support element.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention relates to a support member for glass substrates that is advantageously suited to reduce glass substrate damage induced by either friction, chemical reaction or a combination of friction and chemical reactions.

Figure 1:
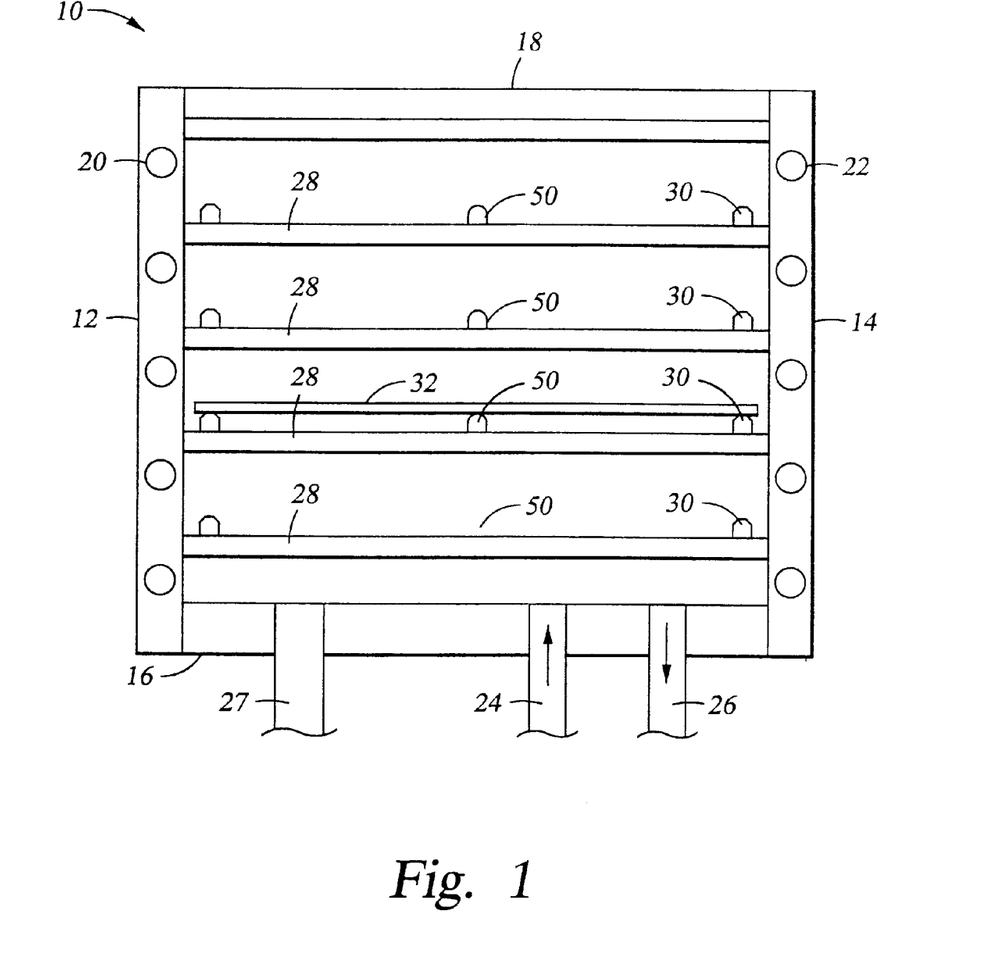
FIG. 1 is a cross sectional view of one embodiment of a heating chamber having a support member according to aspects of the invention disposed therein.

FIG. 1 illustrates an embodiment of a support member of the present invention disposed within a representative heating chamber 10. The conventional heating chamber 10 comprises sidewalls 12, 14, a bottom wall 16 and a lid 18. Additional sidewalls 13, 15, not shown in FIG. 1, are perpendicular to sidewalls 12, 14 completing the structure of the heating chamber 10. Sidewall 13, adjacent to a processing system (not shown) is fitted with a slit valve (not shown) through which the glass plates can be transferred from the processing system into and out of the heating chamber 10.

Sidewalls 12 and 14 are fitted with suitable heating coils 20 for controlling the temperature of the chamber 10. The heating coils may be resistive header or a conduit for circulating a heat transfer gas or liquid. The bottom wall 16 is fitted with inlet and outlet pipes 24 and 26, respectively, for circulation of temperature controlled fluid and/or channel 27 for containing wires for heating coils 20 which are connected to a source of power (not shown). Alternatively, the same channels 24, 26 can be used for both enclosing the heating coils 20 and for circulating a heat transfer medium in the channels 22. The interior of the sidewalls 12, 14 are fitted with a plurality of support elements such as heat conductive shelves 28. The shelves 28 make good thermal contact with the walls 12, 14 to insure rapid and uniform control of the temperature of the shelves 28. Examples of materials that may be used for the shelves 28 include, but are not limited to, aluminum, copper, stainless steel, clad copper, and the like.

Figure 3:
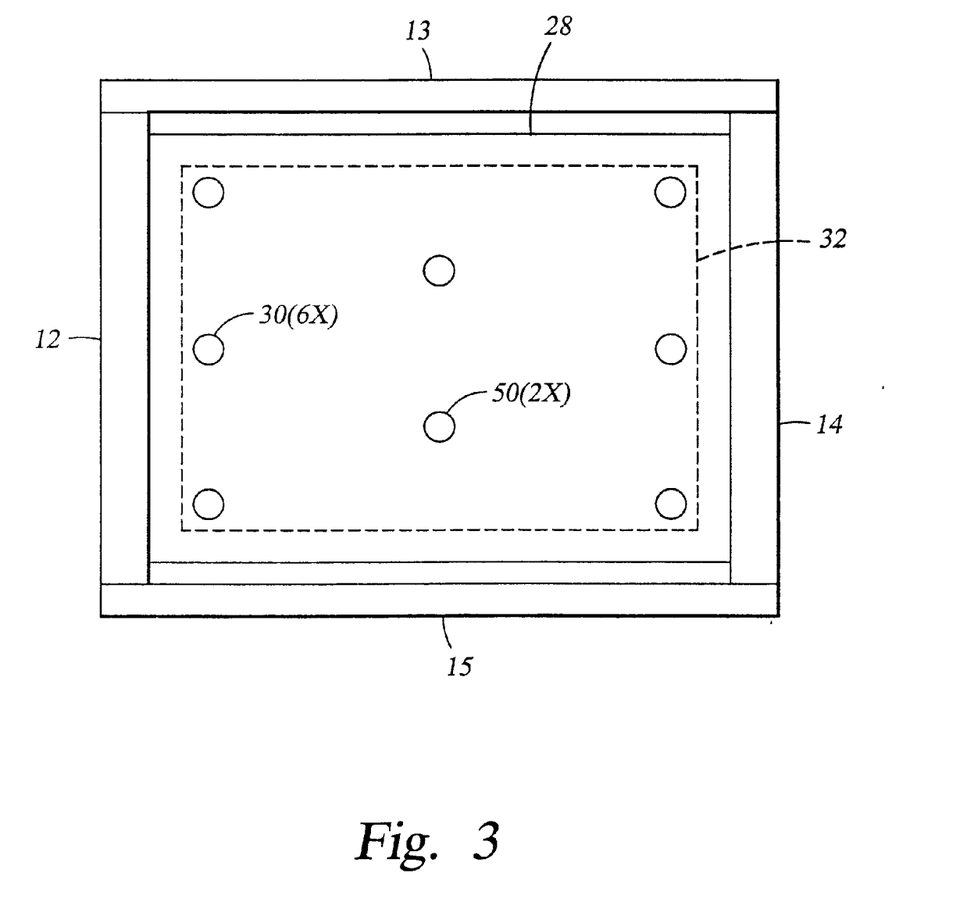
FIG. 3 is a plan view of one embodiment of a shelf having a plurality of support members.

One or more outer support members 30 are suitably arranged on the shelf 28 to support the perimeter of the glass substrate 32 and one or more inner support members 50, according to embodiments of the present invention, are disposed on the shelf 28 to support the central portion of the glass substrate 32. In the embodiment depicted in FIG. 3, three support members 30 are disposed on opposing sides 12 and 14 of the shelf 28 to support the perimeter of the substrate 32 while two support members 50 are disposed inward of the support members 30 to support a center portion of the glass substrates 32.

Returning to FIG. 1, the support members 30, 50 serve to support the glass substrates 32 to be processed so that there is a gap between the shelves 28 and the glass substrates 32. This gap insures that direct contact of the shelf 28 to the glass substrates 32 is avoided which might stress and crack the glass substrates 32 or result in contaminates being transferred from shelf 28 to the glass substrates 32. Glass substrate 32 is heated indirectly by radiation and gas conduction rather than by direct contact between the glass substrate 32 and the shelves 28.

Further, the interleaving of the glass substrates 32 and the shelves 28 provides heating of the glass substrates 32 from both above and below, providing more rapid and more uniform heating of the glass substrates 32.

Figure 2:
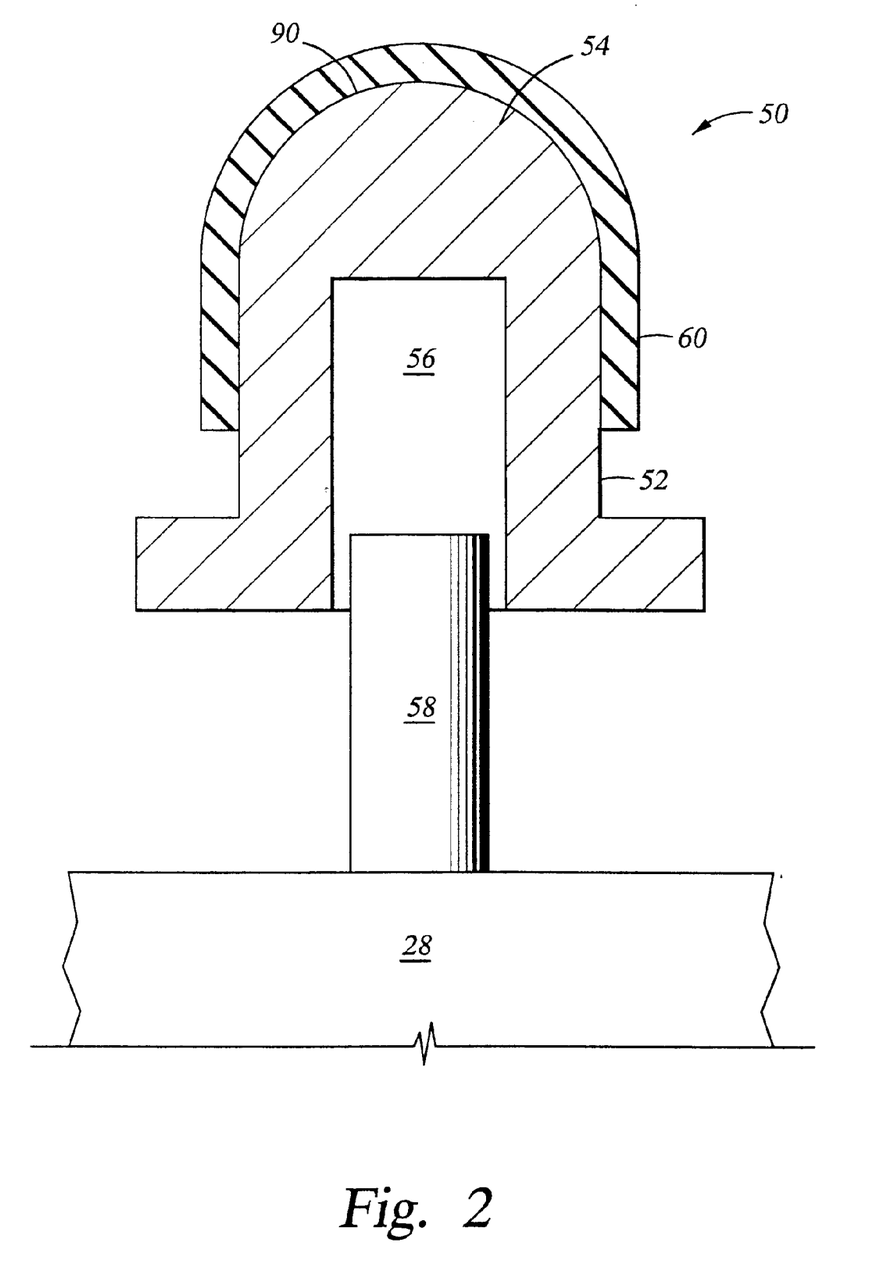
FIG. 2 is a sectional view of one embodiment of a support member according to aspects of the invention.

FIG. 2 is a sectional view of one embodiment of an inner support member 50 according to aspects of the present invention. The inner support member 50 includes a base structural member 52 having a generally cylindrical cross section and a rounded top most portion 54. Glass substrates supported by inner support member 50 make contact and are supported by an area adjacent or in proximity to round top most portion 54. The base structure member 52 has a hollow center 56 adaptively formed to receive the mounting pin 58, thereby supporting the inner support member 50 upon its representative shelf 28 inside the heating chamber 10. One advantage of using the mounting pin 58 instead of mounting the inner substrate support 50 directly onto the shelf 28 is that material selection criteria for the inner support member 50 and the shelf 28 may differ and will likely result in selection of different materials and possible problems involving different thermal coefficients of expansion for the selected materials and related mismatch of the thermal coefficients of expansion. By using the pin 58, the inner support member 50 may expand and contract separately from the expansion and contraction of the adjacent shelf 28.

The top most portion 54 of the base structural member 52 has a rounded and smooth outer surface. In one embodiment, the top most portion 54 includes a hemispherical, conical, ellipsoidal or parabolic end. The top most portion 54 may have either a machined or polished finish or other suitable finish of adequate smoothness. In a preferred embodiment, the top most portion 54 has a finish that is R4 finish smooth or better, meaning that the surface is polished to a roughness of less than 4 micro inches. In another preferred embodiment, the cross sectional shape of the inner substrate support 50 is a cylinder having a full radius at the top most portion 54.

The material of base structural member 52 is machined into a shape suited for supporting glass during heat treatment. In one embodiment, the section shape of base structural member 52 is generally cylindrical with a rounded top. In a preferred embodiment, the upper most portion used for supporting the glass substrates is rounded and has a smooth outer surface. Material used to form base structural member 52 is selected for ease of machining and in some embodiments, low costs. In one embodiment, the base structural member 52 is formed from stainless steel or a low carbon content stainless steel. In another embodiment, the base member structure 52 is formed from Inconel or other nickel alloys.

While embodiments of the present invention will be described as having a glass support member having a base structural member 52 formed from a metal or a metal alloy and including a coating layer 60, it is to be appreciated that other materials may be used for the base structural member 52 which may not require the coating layer 60. Base structural member 52 may be formed from materials that provide the friction reducing and chemical 41 reaction inhibiting features of the present invention. For example, base structural member 52 may be quartz or sapphire or other suitable nonmetallic material that provide the advantages of the present invention. In some cases, these alternative materials may be used without the coating layer 60.

The coating layer 60 is typically deposited at least over a tip 90 of the top most portion 54. Alternatively, the coating layer 60 may be deposited over any portion of the top most portion 54 and/or base structural member 52. In one embodiment, the coating layer 60 of the present invention has a sufficient thickness to function as a barrier layer that prevents contact between the base structural member 52 and the glass substrate 32. Moreover, reaction of contaminants between the base structural member 50 and the inner substrate support is substantially prevented as well. In this context, contaminates could be any of a wide variety of materials, including trace materials present within base structural member 52. For example, chromium is present in many grades of stainless steel suited to be used as base structural member 32. It is believed that barrier layer embodiments of the surface coating 60 of the present invention are capable of reducing or eliminating reactions between chromium present in the base structural member 32 and the glass substrate 32. In embodiments where the coating layer 60 reduces or eliminates reactions between the base material 52 and the glass substrate 32, the top most portion 54 may be rounded and/or have a flat center portion upon which the glass 32 is supported. The flat center portion is typically surrounded by a chamfer or radius to minimize potential scratching during loading and heating of the substrate 32.

Embodiments of a coating layer 60 capable of reducing or eliminating reactions between the base material 52 and the glass substrate 32 include CVD nitration processes and PVD sputtering processes. For example, a base structural member 52 shaped as described above may be placed in a reaction chamber and exposed to an atmosphere comprising ammonia, and/or nitrogen, and/or hydrogen, and/or other reducing gasses to form a nitration layer upon the exposed surfaces of the base structural member 52. As a result of this process, a CVD nitride coating layer 60 is formed over the top most portion 54 of the base structural member 52.

The CVD process described above or another suitable process for forming a nitride surface on the exposed surface of base structural member 52 continues until the nitride layer is sufficiently thick to reduce or prevent reaction between the base structural member 52 and the glass substrate 32. In one embodiment, the coating layer 60 is formed by CVD to a thickness of at least about 3 microns. In another embodiment, the coating layer 60 is formed by CVD to a thickness from between about 3 microns to about 20 microns.

In an alternative embodiment, coating layer 60 capable of reducing or eliminating reaction between the base material 52 and the glass substrate 32 is sputtered onto at least the top most portion 54 of the base structural member 52. In one embodiment, the coating layer 60 is formed by a suitable physical vapor deposition (PVD) process to form a nitrated surface on the outer surface of the base structural member 52. In a preferred embodiment, the coating layer 60 comprises titanium nitride and is formed by a sputtering method, such as physical vapor deposition. In another alternative embodiment, the coating layer 60 is formed by physical vapor deposition and has a thickness sufficient to reduce or eliminate chemical reactions between the base structural member 52 and the glass substrate 32. In yet another alternative embodiment, the coating layer 60 is formed by a physical vapor deposition method and is at least about 3 microns thick. In yet another alternative embodiment, the PVD coating layer is between about 3 microns and about 20 microns thick. In yet another alternative embodiment, the coating layer is titanium nitride formed by sputtering or other physical vapor deposition process.

In an alternative embodiment, a coating layer 60 operates as a friction reduction layer between structural member 52 and the glass substrate 32. In this context, friction reduction refers to a reduction or elimination of damage to the glass substrate 32 caused by rubbing, vibration or other contact between the glass substrate 32 and the inner support member 50. It is believed that embodiments of the friction reducing surface coating layer 60 of the present invention are conformable films so that the overall shape of the base structural member 52 is preserved. In a preferred embodiment of the friction reducing coating layer 60, the coating layer 60 is conformal and maintains a smooth polished finish of the underlining base structural member 52.

Embodiments of the coating layer 60 capable of reducing friction induced damage of glass substrates 32 include CVD nitration processes and PVD sputtering processes. For example, a base structural member 52 shaped as described above, may be placed in a reaction chamber and exposed to an atmosphere comprising ammonia, and/or nitrogen, and/or hydrogen, and/or other reducing gases to form the nitration layer on the exposed surfaces of the base structural member 52. As a result of this process, a conformal CVD nitride surface coating layer 60 is formed over the top most portion of base structural member 52. The CVD process described above or other suitable processes continue until the nitride layer is sufficiently thick and conformal to reduce friction damage between the inner support member 50 and the glass substrate 32.

In one alternative embodiment, the friction reducing coating layer 60 is formed by CVD to a thickness of at least about 3 microns. In another embodiment, the friction reducing coating layer 60 is formed by CVD to a thickness from about 3 microns to about 30 microns.

In an alternative embodiment, a coating layer 60 capable of reducing friction damage between the inner support member 50 and the glass substrate 32 is sputtered onto the outer surface of base structural member 52. In one embodiment, a friction reducing coating layer 60 is formed by a suitable physical vapor deposition (PVD) process to form a nitrated surface over at least the top most portion 54 of base structural member 52. In a preferred embodiment, the friction reducing coating layer 60 comprises titanium nitride and is formed by a sputtering method or a physical vapor deposition. In another alternative embodiment, the friction reducing coating layer 60 is formed by a physical vapor deposition and is conformal to the shape and finish of the base structural member 52 with a thickness sufficient to reduce friction damage of the glass substrate 32 by the inner support member 50.

In yet another alternative embodiment of the friction coating layer 60 of the present invention, the coating layer 60 is formed by physical vapor deposition and is conformal to the shape of the inner support member 50. The coating layer 60 conforms to the polished finish of base structural member 52 and top most portion 54. The coating layer 60 typically is at least about 3 microns thick. In yet another alternative embodiment, the PVD coating layer is conformal and is between about 3 microns and about 20 microns thick. In yet another alternative embodiment, the coating layer 60 is a conformal titanium nitride layer formed by sputtering or other physical vapor deposition process.

It is to be appreciated that regardless of formation method, the surface coating layer 60 provides a smooth outer surface to base structural member 52. It is believed that the alternative embodiments described above of the surface coating layer 60 maintain a smooth surface at least as smooth as the original finish of base structural member 52. Alternatively, the coating layer 60 may be processed to have a finish. It is also believed that inner support members 50, formed according to the present invention and having a surface coating layer 60 described above, will reduce the friction between the glass substrate 32 supported on the inner support member 50 and, in some embodiments, will also reduce chemical reactions between metals or other contaminants within base structural member 52 and/or the glass 32 disposed thereon.

It is to be appreciated that an inner support member 50 fabricated in accordance with aspects of the present invention is suited for heat treatment operations conducted above 250° C. Other heat treatment operations may also be performed using the inner support member 50 of the present invention, such as the heat treatment processes used in the fabrication of low temperature poly silicon. It is believed that glass support members fabricated in accordance with the present invention are suited for heat treatment operations conducted above about 450° C. up to and including 600° C., depending upon the application and glass material properties. It is believed that surface coating layer 60 described above provides a protective layer that both reduces the likelihood of friction damage between the base structural member 52 and the glass substrate to be supported while also acting as a barrier layer to prevent reaction between either contaminants or metals within base structural member 52 and the glass substrate 32.

Embodiments of the inner support member 50 have been shown and described above as a center support to reduce damage that may result in abnormal cleaving operations or active area damage that may adversely impact device yield. The embodiments described above illustrate an inner support member 50 as a center support while conventional outer support members 30 may be used for support of the periphery of glass panel 32. It is to be appreciated that the outer support members 30 may be advantageously configured similar to the inner support members 30, particularly for high temperature glass process sequences. As a result of using glass support members 30 and 50 configured as the inner support member 50 is described with reference to FIG. 2, damage to the glass substrate 32 may be reduced or eliminated, thereby increasing the yield of a given glass substrate.

While the support members 30 and 50 have been described with regard to particular materials and impurities, it is to be appreciated that other heat treatment applications may require base structural supports 52 fabricated from other, different materials, thereby requiring alternative coating layers 60 to act as a barrier layer to other different impurities as those described above.

While the invention has been described for use with glass substrates, other embodiments of the support members 30 and 50 of the present invention may be used to reduce friction damage and chemical reaction between the support members 30, 50 and different substrate materials. For example, a coating layer 60 may be selected to prevent the diffusion of base material 52 impurities into alternative substrate types, such as, for example, plastic substrates. While the present invention has been described as used in a heating system 10 described above, other heat treatment systems and chambers may be used. For example, resistive heaters may be incorporated directly into shelves 28 to provide heating and temperature controls of glass substrates 32 to be processed therein. Methods and apparatus of the present invention may be practiced independently and irrespective of the type of heat chamber in which the embodiment of the present invention is employed.

While the design of a hollow center 56 and a mounting pin 58 have been described above with their beneficial application to accommodate for thermal expansion mismatch, the support members 30 and 50 may be attached to shelf 28 using other means. Other forms of mechanical attachment, such as cold pressing, for example, may be used to attach glass support members 30 and 50 to a shelf 28. It is to be appreciated that the method of attaching or fixing embodiments of the glass support members 30 and 50 to the heating shelf 28 are contemplated.

While the coating layer 60 described and illustrated above is shown in the upper portion 54 and covering only a portion of the base structural member 52, it is to be appreciated that other degrees of coating may be used. For example, coating layer 60 may cover all exposed portions of base structural member 52 or may be used only to cover the upper portion 54. In some embodiments, coating layer 60 may cover all surfaces of the base structural member 52 including those in contact with the shelf 28. In preferred embodiments, the amount of coating layer 60 applied to base structural member 52 is optimized to provide the chemical and/or friction reducing advantages of the present invention.

Figure 4:
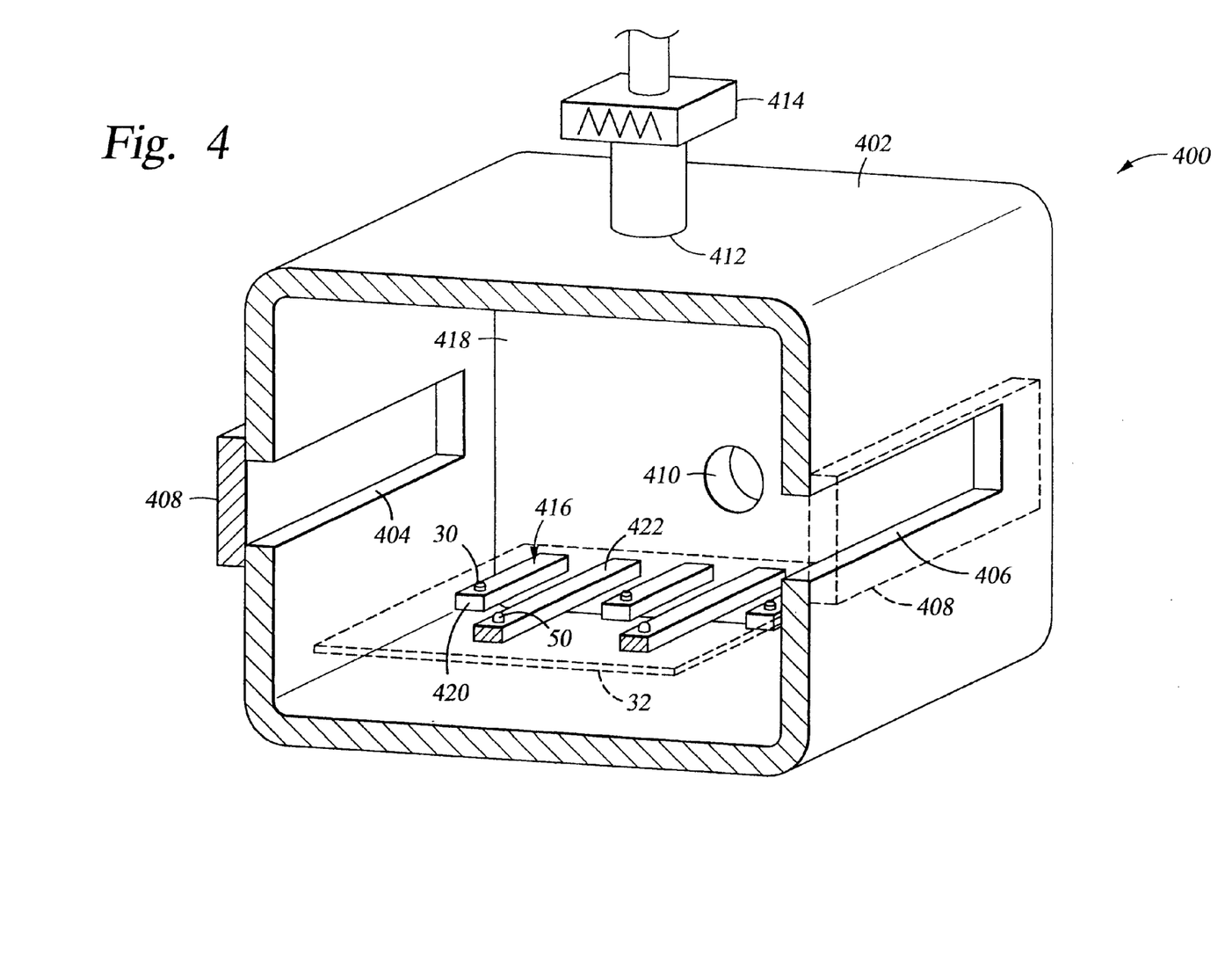
FIG. 4 is a sectional view of one embodiment of a load lock chamber of a support element having a plurality of support members.

FIG. 4 depicts a sectional view one embodiment of a load lock chamber 400 having a plurality of support members 30 and at least one support member 50 disposed therein. The load lock chamber 400 generally includes a chamber body 402 having a first glass transfer port 404 and a second glass transfer port 406 disposed therein. Generally, each port 404, 406 is selectively sealed by a slit valve 408. Generally, the load lock chamber 400 is disposed between a first atmosphere and a vacuum atmosphere, for example, contained in chambers (not shown) disposed respectively at the first and second ports 404, 406, and is utilized to permit glass 32 transfer into and out of the vacuum atmosphere without loss of vacuum. the chamber body 402 additionally includes a pumping port 410 through which pressure within the chamber body 402 may be regulated. Optionally, the chamber body 402 may include a vent 412 for raising the pressure within the chamber body 402 which the chamber body 402 is under vacuum conditions. Typically, the air or fluid entering the chamber 400 through the vent 412 is passed through a filter 414 to minimized the particles entering the chamber 400. Such filters are generally available from Camfil-USA, Inc., Riverdale, N.J.

A plurality of support elements 416 are generally disposed within the chamber body 402, each supporting at least one support member 30 and/or 50. Each support element 416 is typically coupled to at least one wall 418 of the chamber 400. In the embodiment depicted in FIG. 4, the support elements 416 comprise a first group of support elements 420 that are coupled cantilevered to the wall 418 and a second group of support elements 422 that are coupled between the wall 418 and an opposing wall (not shown). Generally, the first group of support elements 420 have the support members 30 that support the perimeter of the glass 32 thereon while the second group of support elements 422 support the center portion of the glass 32. Alternatively, the support members may be coupled to other portions of the chamber body 402 such other sidewalls, the bottom or combinations thereof. Additionally, some or all of the support members 30 may be disposed on support elements 416 that extend between the sidewalls while some or all of the support members 50 may be disposed on support elements 416 that are coupled to only one portion of the chamber body (i.e., coupled cantilevered). Furthermore, one or more of the support members 30 may be configured similar or identical to the support member 50. Other load locks may be configured to utilize the support members 50 including those that handle multiple substrates stacked within the chamber 400 on a second set of support elements disposed in a plane above and parallel to the support elements 416 shown in FIG. 4.

While the foregoing is directed to embodiments of the present invention, other and further embodiments of the invention may be devised without departing from the basic scope thereof, and the scope thereof is determined by the claims that follow.

What is claimed is:

1. An apparatus for supporting a glass substrate, comprising:

a support element;

a plurality of support members disposed on the support element, at least one of the support members comprising:

a base structural member coupled to the support element; and a rounded top portion adapted to support the glass substrate in a spaced-apart relation to the support element; and a plurality of mounting pins coupled to the support element, each pin engaged with a respective support member.

2. The apparatus of claim 1, wherein the rounded top portion has a surface roughness of 4 micro inches or smoother.

3. The apparatus of claim 1, wherein the rounded top portion further comprises a hemispherical, conical, ellipsoidal or parabolic end.

4. The apparatus of claim 1, wherein the base structural member is hollow and receives at least a portion of the mounting pin.

5. The apparatus of claim 1, wherein the plurality of support members further comprises:

a first set of support members disposed along at least a portion of a perimeter of the support element; and at least a second set of support members comprising at least one support member disposed inward of the first set.

6. The apparatus of claim 1, wherein at least one of the support members comprises a non-metallic material.

7. The apparatus of claim 6, wherein at least one of the support members comprises quartz or sapphire.

8. The apparatus of claim 1, wherein at least one of the support members comprises stainless steel or nickel alloy.

9. The apparatus of claim 1, wherein at least one of the support members further comprises a coating.

10. The apparatus of claim 9, wherein the coating is a nitride layer.

11. The apparatus of claim 10, wherein the rounded top portion has a surface roughness of 4 micro inches or smoother.

12. The apparatus of claim 9, wherein the coating has a surface roughness of 4 micro inches or smoother.

13. The apparatus of claim 1, wherein the support element is a shelf.

14. An apparatus for supporting a glass substrate, comprising:

a shelf;

a plurality of support members disposed on the shelf, at least one of the support members comprising:

a base structural member coupled to the shelf;

a top portion adapted to support the glass substrate in a spaced-apart relation to the shelf;

a coating disposed on at least a tip of the top portion; and a plurality of mounting pins coupled to the support element, each pin engaged with a respective support member.

15. The apparatus of claim 14, wherein the top portion has a surface roughness of 4 micro inches or smoother.

16. The apparatus of claim 14, wherein the top portion further comprises a hemispherical, conical, ellipsoidal or parabolic end.

17. The apparatus of claim 14, wherein the top portion further comprises a flat center portion.

18. The apparatus of claim 14, wherein the base structural member is hollow and receives at least a portion of the mounting pin.

19. The apparatus of claim 14, wherein the plurality of support members further comprises:

a first set of support members disposed along at least a portion of a perimeter of the shelf; and at least a second set of support members comprising at least one support member disposed inward of the first set.

20. The apparatus of claim 14, wherein at least one of the support members comprises a non-metallic material.

21. The apparatus of claim 14, wherein at least one of the support members comprises quartz or sapphire.

22. The apparatus of claim 14, wherein at least one of the support members comprises stainless steel or nickel alloy.

23. The apparatus of claim 14, wherein the coating is a nitride layer.

24. The apparatus of claim 14, wherein the coating has a surface roughness of 4 micro inches or smoother.

25. An apparatus for supporting a glass substrate, comprising:

a chamber;

a plurality of shelves disposed in a spaced-apart relation in the chamber, each shelf having a plurality of support members disposed thereon, at least one of the support members comprising:

a base structural member coupled to the shelf; and a rounded top portion adapted to support the glass substrate in a spaced-apart relation to the shelf; and a plurality of mounting pins coupled to each shelf, each pin engaged with a respective support member.

26. The apparatus of claim 25, wherein the chamber further comprises:

at least one sidewall having a resistive heat or conduit for flowing a heat transfer fluid.

27. The apparatus of claim 25, wherein the rounded top portion has a surface roughness of 4 micro inches or smoother.

28. The apparatus of claim 25, wherein the rounded top portion further comprises a hemispherical, conical ellipsoidal or parabolic end.

29. The apparatus of claim 25, wherein the base structural member is hollow and receives at least a portion of the mounting pin.

30. The apparatus of claim 25, wherein the plurality of support member further comprises:

a first set of support members disposed along at least a portion of a perimeter of the shelf; and at least a second set of support members comprising at least one support member disposed inward of the first set.

31. The apparatus of claim 25, wherein the at least one of the support members comprises non-metallic material.

32. The apparatus of claim 25, wherein the at least one of the support members comprises quartz or sapphire.

33. The apparatus of claim 25, wherein the at least one of the support members comprises stainless steel or nickel alloy.

34. The apparatus of claim 25, wherein the at least one of the support members further comprises:

a coating.

35. The apparatus of claim 34, wherein the coating is a nitride layer.

36. The apparatus of claim 34, wherein the rounded top portion has a surface roughness of 4 micro inches or smoother.

37. The apparatus of claim 34, wherein the coating has a surface roughness of 4 micro inches or smoother.

38. Apparatus for supporting a glass substrate, comprising:
   a chamber body having a least one sidewall;
   a plurality of support elements coupled to the sidewall;
   a first slit valve selectively sealing a first glass transfer port disposed in the chamber body; and
   a second slit valve selectively sealing a second glass transfer port disposed in the chamber body;
   a plurality of support members disposed on the support elements, where at least one of the support members comprises:
      a base structural member coupled to the support elements; and
      a rounded top portion adapted to support the glass substrate in a spaced-apart relation to the support element; and
   a plurality of mounting pins coupled to the support element, each pin engaged with a respective support member.

39. An apparatus for supporting a glass substrate, comprising:
   a support element;
   a plurality of mounting pins coupled to the support element;
   a plurality of support members disposed on the mounting pins, at least one of the support members comprising:
      a hollow base portion adapted to receive at least a portion of the mounting pin; and
      a rounded top portion adapted to support the glass substrate in a spaced-apart relation to the support element.

40. The apparatus of claim 39, wherein the rounded top portion has a surface roughness of 4 micro inches or smoother.

41. The apparatus of claim 39, wherein at least one of the support members comprises quartz or sapphire.

42. The apparatus of claim 39, wherein at least one of the support members comprises stainless steel or nickel alloy.

43. The apparatus of claim 39, wherein at least one of the support members is coated with a nitride layer.

* * * * *

UNITED STATES PATENT AND TRADEMARK OFFICE
CERTIFICATE OF CORRECTION

PATENT NO. : 6,528,767 B2
DATED : March 4, 2003
INVENTOR(S) : Bagley et al.

It is certified that error appears in the above-identified patent and that said Letters Patent is hereby corrected as shown below:

Column 2,
Line 26, please change "of the of the support" to -- of the support --.

Column 3,
Line 15, please change "be resistive header" to -- be a resistive heater --.

Column 4,
Line 43, please delete "41".

Column 10,
Line 39, please change "conical ellipsoidal" to -- conical, ellipsoidal --.

Signed and Sealed this

Thirteenth Day of July, 2004

JON W. DUDAS
*Acting Director of the United States Patent and Trademark Office*